US005657287A

United States Patent [19]
McLaury et al.

[11] Patent Number: 5,657,287
[45] Date of Patent: Aug. 12, 1997

[54] ENHANCED MULTIPLE BLOCK WRITES TO ADJACENT BLOCKS OF MEMORY USING A SEQUENTIAL COUNTER

[75] Inventors: Loren L. McLaury; Donald M. Morgan, both of Boise, Id.

[73] Assignee: Micron Technology, Inc., Boise, Id.

[21] Appl. No.: 455,095

[22] Filed: May 31, 1995

[51] Int. Cl.$^6$ .................................................. G11C 7/00
[52] U.S. Cl. ................... 365/230.01; 365/230.03; 365/230.05
[58] Field of Search .................. 365/230.09, 230.03, 365/230.01, 239, 240, 78, 230.05

[56] References Cited

U.S. PATENT DOCUMENTS

| | | | |
|---|---|---|---|
| 4,152,780 | 5/1979 | Eberlin | 365/238 |
| 4,599,709 | 7/1986 | Clemons | 365/200 |
| 4,809,156 | 2/1989 | Taber | 364/200 |
| 4,873,671 | 10/1989 | Kowshik et al. | 365/230.09 |
| 5,126,975 | 6/1992 | Handy et al. | 365/230.01 |
| 5,179,372 | 1/1993 | West et al. | 340/799 |
| 5,235,545 | 8/1993 | McLaury | 365/189 |
| 5,239,509 | 8/1993 | Ikawa et al. | 365/230.05 |
| 5,253,213 | 10/1993 | Matsumura et al. | 365/230.09 |
| 5,282,177 | 1/1994 | McLaury | 365/230.05 |
| 5,287,324 | 2/1994 | Nagashima | 365/230.05 |
| 5,313,433 | 5/1994 | Waller | 365/230 |
| 5,367,495 | 11/1994 | Ishikawa | 365/230.09 |
| 5,406,527 | 4/1995 | Honma | 365/230.05 |
| 5,444,660 | 8/1995 | Yamanaka et al. | 365/189 |

*Primary Examiner*—David C. Nelms
*Assistant Examiner*—Michael T. Tran
*Attorney, Agent, or Firm*—Schwegman, Lundberg, Woessner & Kluth, P.A.

[57] ABSTRACT

A memory device includes an array of randomly addressable registers. Blocks of the addressable registers are addressable by an address for block writing during a block write cycle. The blocks are of the size n, wherein n is the number of bits per plane of memory being written during the block write cycle. The device further includes a sequential counter for incrementing the address by n during burst mode when a block write is performed during a block write cycle to address a next addressable register of the array of randomly addressable registers.

14 Claims, 9 Drawing Sheets

ENHANCED MULTIPLE BLOCK WRITES TO ADJACENT BLOCKS OF MEMORY USING A SEQUENTIAL COUNTER

TECHNICAL FIELD OF THE INVENTION

The present invention pertains generally to the field of memory devices. In particular, the present invention relates to block write functions in memory devices.

BACKGROUND OF THE INVENTION

Multi-port random access memories (RAM) are faster than standard RAM. They are commonly referred to as video random access memories (VRAM) because of their effectiveness in video systems. One such multi-port memory is described in U.S. Pat. No. 4,891,794 issued to Hush et al., entitled "Three Port Random Access Memory," and assigned to the assignee of the present invention and incorporated herein by reference thereto. In simple form, a VRAM includes a dynamic random access memory (DRAM) and DRAM controller, and a serial access memory (SAM). Each SAM is essentially a long shift register which can receive a block of data from the DRAM and serially shift the data out through a data port. The SAM can also serially shift data in through the serial port and transfer the data to the DRAM.

The DRAM is a dynamic array for storing multi-bit memory registers in multiple two dimensional planes. Each memory register has a memory cell in each plane. The DRAM has column and row address line inputs and a plurality of input/output lines. Each of the cells in a multi-bit memory registers is defined by the same row and column address in the multiple planes. Each SAM has a multi-bit register row associated with each of the planes of the DRAM. The columns of the DRAM correspond to the bits of the SAM register row.

Various features have been incorporated in VRAMs to speed the transfer of data to and from an associated graphics processor or microprocessor. One example of a function used to speed memory writing is the "block write" function. U.S. Pat. No. 5,282,177 issued to McLaury, entitled "Multiple Register Block Write Method and Circuit for Video DRAMs," assigned to the assignee of the present invention and entirely incorporated herein by reference thereto, describes several methods and circuits for block writing to a DRAM.

The block write is useful in a VRAM to quickly clear a large area of frame buffer or to create a background for a display. The block write function simultaneously writes from a write register, which in certain applications be a color register, to a block of adjacent multi-bit memory registers instead of writing to each register individually. The block of multi-bit memory registers can be a preselected number of registers in a row of the DRAM (selective block write function) or the entire row of memory registers (flash block write function). The block of cells of the block of multi-bit memory registers in each plane of memory is written to the same state. That is, one bit of a multi-bit write register is written to each block of cells in a plane.

U.S. Pat. No. 5,282,177 discloses a multiple register block write. The multiple register block write is similar to the block write described above except the write register has multiple registers. The multiple write register has a plurality of eight bit static memory registers. Any one of the plurality of write memory registers can transfer data to the VRAM. The multiple write register, therefore, eliminates the need to re-load a single write register for different block writes by preloading all of the multiple write memory registers.

In order to perform the selective block write function described above, an initial start address, including a row and column address, is latched to address the first memory register of a preselected block of memory registers such that data can then be written simultaneously from one or more write registers to the preselected block of adjacent memory registers. Similarly, in flash block write, an initial row address is latched to address the first memory register of a row of multi-bit memory registers such that data can then be written simultaneously from one or more write registers to the row of memory registers.

However, in selective block write, an externally generated column address is strobed to the DRAM via the address pins for each block write cycle in the row addressed. Such addressing is inefficient when it is desired to perform multiple block writes to adjacent blocks of memory registers.

For the reasons stated above, and for other reasons stated below which will become apparent to those skilled in the art upon reading and understanding the present specification, there is a need in the art for a memory device that provides for more efficient addressing when it is desired to perform multiple block writes to adjacent blocks of memory registers.

SUMMARY OF THE INVENTION

The above-mentioned addressing inefficiencies with regard to block write functions and other problems are addressed by the present invention and will be understood by reading and studying the following specification. A memory device for addressing such inefficiencies includes an array of randomly addressable registers. Blocks of the addressable registers are addressable by an address for block writing during a block write cycle. The device further includes a sequential counter for incrementing the address when at least one individual block write is performed during at least one block write cycle to address a next addressable register of the array of randomly addressable registers. In one embodiment of the device, the blocks are of the size n, wherein n is the number of bits per plane of memory being written during the block write cycle and the counter increments the address by n.

A method of addressing a memory device is also described for overcoming such inefficiencies. The method includes providing an array of randomly addressable registers. Blocks of the addressable registers are addressed by an address to perform a block write. The address is internally incremented for addressing a next addressable register upon performance of the block write.

DETAILED DESCRIPTION OF THE INVENTION

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

The present invention includes a block write mode of operation in a burst mode for a DRAM. The block write mode operation in burst mode provides the ability to internally address the DRAM to perform multiple adjacent block writes to a random access memory (RAM). Such internal addressing of memory allows block write mode to operate in burst mode. This allows adjacent blocks of memory registers or single memory registers to be addressed at a much faster rate than if an address for either an adjacent block or for a single memory register must be strobed to the RAM via its address pins after a block write. The present invention shall be further described with reference to FIGS. 1-6.

Figure 1:
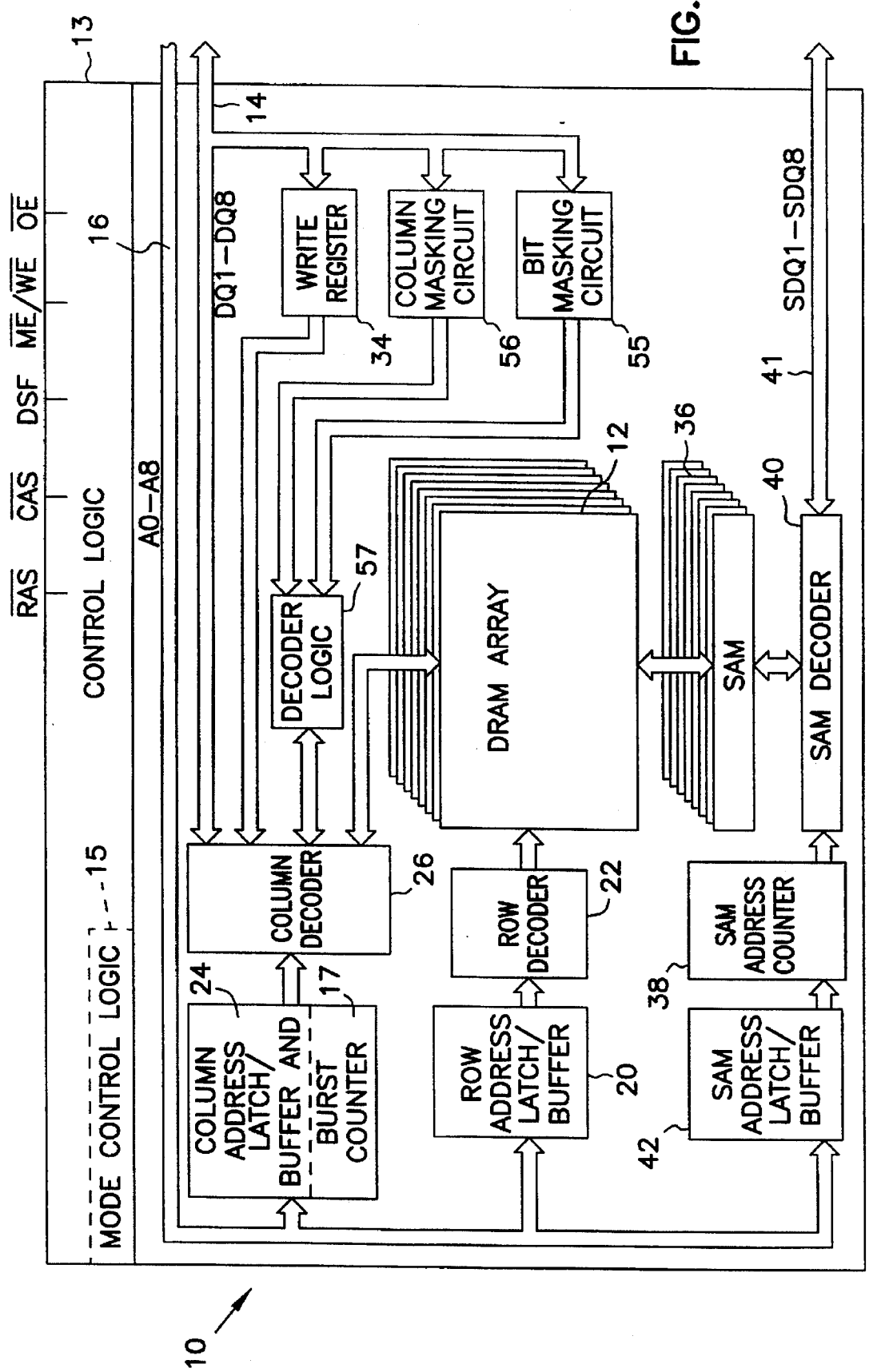
FIG. 1 is a block diagram of a VRAM having DRAM addressable in accordance with the present invention.

FIG. 1 illustrates a block diagram of a multi-port memory or VRAM 10 incorporating the present invention. Detailed elements of portions of the memory have been let out of the figure to focus on the features more directly relevant to the burst mode block write function in accordance with the present invention. Such omitted detailed elements of the operation of VRAMs and their applications are known to one skilled in the art. For example, VRAMs with block write function are available from Micron Technology Inc., Boise, Id. the assignee of the present invention. Description of such memories entirely incorporated herein by reference thereto can be found on pages 2-139 to 2-180 of "The Specialty DRAM Databook" (date 1993) available from Micron Semiconductor, Inc. Further, as previously stated, U.S. Pat. No. 5,282,177 issued to McLaury, entitled "Multiple Register Block Write Method and Circuit for Video DRAMs," assigned to the assignee of the present invention and entirely incorporated herein by reference thereto, describes several methods and circuits for block writing to a DRAM. While a VRAM is illustrated, the functions and methods described below are equally applicable to dynamic memories in general, and at least in part to other types of memory devices such as static random access memories.

The VRAM 10 of FIG. 1 includes a DRAM army 12 which can be accessed by a microprocessor (not shown) through input/output connections including address lines A0–A8. In the embodiment described, the DRAM array 12 is a 512 by 512 by 8 bit array; however, the array may be any other configuration which may benefit from the addressing techniques described herein. The DRAM array 12 has a plurality of memory registers, each memory register, including eight dynamic memory cells. More specifically, the DRAM array 12 includes rows and columns of eight-bit randomly addressable memory registers, with each cell of the memory register being in a different plane of the array 12. In other words, each eight-bit memory register is made up of memory cells from the eight planes having the same row and column addresses, thus forming addressed rows and columns of eight-bit memory registers.

The VRAM 12 is accessed through address bus 16, row and column address strobe signals RAS* and CAS*, a special function signal DSF, a mask enable/write enable signal ME*/WE*, an output enable signal OE* and by using other conventional control signals (not shown) which are known to one skilled in the art. Row address latch/buffer 20 and row decoder 22 receive and decode a row address from a row address signal provided on address lines A0–A8, and address or activate a corresponding row of the DRAM array 12. Likewise, column address latch/buffer 24 including burst counter 17 and column decoder 26 receive or generate and decode a column address from a column address signal provided on address lines A0–A8, and address or activate the corresponding column of the DRAM array 12. Burst counter 17 as described further below allows the internal column addressing within a row when operating in a burst mode. A DRAM may be set so as to always operate in burst mode for column addressing, or burst mode may be selected by inputs thereto such as having OE* and DSF high and ME*/WE* low when RAS* falls. The present invention is not limited to any one manner of setting burst mode operation for the VRAM, but is only limited as described in the accompanying claims.

Data bus 14 receives memory register data during a write cycle from the microprocessor and supplies it to column decoder 26 for writing to DRAM array 12. Data stored in the DRAM 12 can be transferred to column decoder 26 during a read cycle for output of data DQ1–DQ8 on data bus 14. A SAM 36, is also provided as an independent memory and connected to the DRAM array 12 for transfer of data therebetween. DRAM 12 and SAM 36 can operate either independently or in limited combination for internal data transfers.

SAM 36 is a single row of eight-bit memory registers, with columns corresponding to the columns of DRAM array 12. SAM 36, when appropriately activated, simultaneously transfers data between its memory registers and the memory registers of a row of DRAM array 12. A SAM address counter 38 is associated with SAM 36 to generate sequential SAM column addresses. A SAM decoder 40 receives the generated addresses. SAM decoder 40 has a serial data bus 41 connected to produce and receive serial data signals SDQ1 through SDQ8. SAM decoder 40 is responsive to the sequential SAM column address from SAM address counter 38 to transfer data between the corresponding column of SAM 36 and serial data bus 41. A SAM address latch/buffer 42 receives a beginning SAM column address signal from address bus 16 and initializes SAM address counter 38 accordingly. One skilled in the art will recognize that multiple SAMs can be utilized without departing from the scope of the present invention.

Control logic 13, including timing generation (not shown) and mode control logic 15 is used to control the many available functions of the VRAM. Various control circuits and signals initiate and synchronize the VRAM operation. However, since this invention is concerned primarily with the block write functions of VRAM 10, and since VRAM circuits and operational details are well documented and known to those skilled in the art, they will not be described in detail herein.

Some of the input and outputs of VRAM 10 used to communicate with a microprocessor are described as follows. Mask enable/write enable input (ME*/WE*) is used to perform a masked write function. The ME*/WE* can also be used to select a read or write cycle when accessing the DRAM; this includes a read transfer or write transfer with the SAM. Special function select input (DSF) is used to indicate use of a special function (block write, flash write, etc.). Row address strobe (RAS*) input is used to clock in the nine row address bits and strobe for ME*/WE*, DSF, CAS*, and DQ inputs. In standard multi-port memories, the RAS* also acts as the master chip enable and must fall for the initiation of any DRAM array or transfer operation. Column address strobe (CAS*) input is used to clock in the nine column address bits.

Address input lines A0–A8 are used to identify a row and column address to select at least one eight-bit word or memory register out of the available memory registers of DRAM array 12, as described above. DRAM data input/output lines DQ1–DQ8 provide data input and output for the DRAM array 12 and also act as inputs for write register 34, column masking circuit 56 and bit masking circuit 55 which shall be described in further detail below. It may also be an input/output for other circuits depending upon the functionality performed by the VRAM.

There are many modes or functions which can be performed using VRAMs. The two functions to be described in further detail in accordance with the present invention include block write and block write operating in burst mode. The block write function is used to write the contents of write register 34 to a preselected block of memory registers of DRAM array 12 or a row of memory registers. These two block write operations for DRAMs, as described above, are known to those skilled in the art. They have been previously referred to as selective block write and flash block write. Selective block write shall be further described below. The block write operating in burst mode function utilizes the burst counter 17 to internally accomplish addressing during selective block write function to eliminate certain external addressing as described below to increase the transfer speed of the DRAM array 12.

Figure 2:
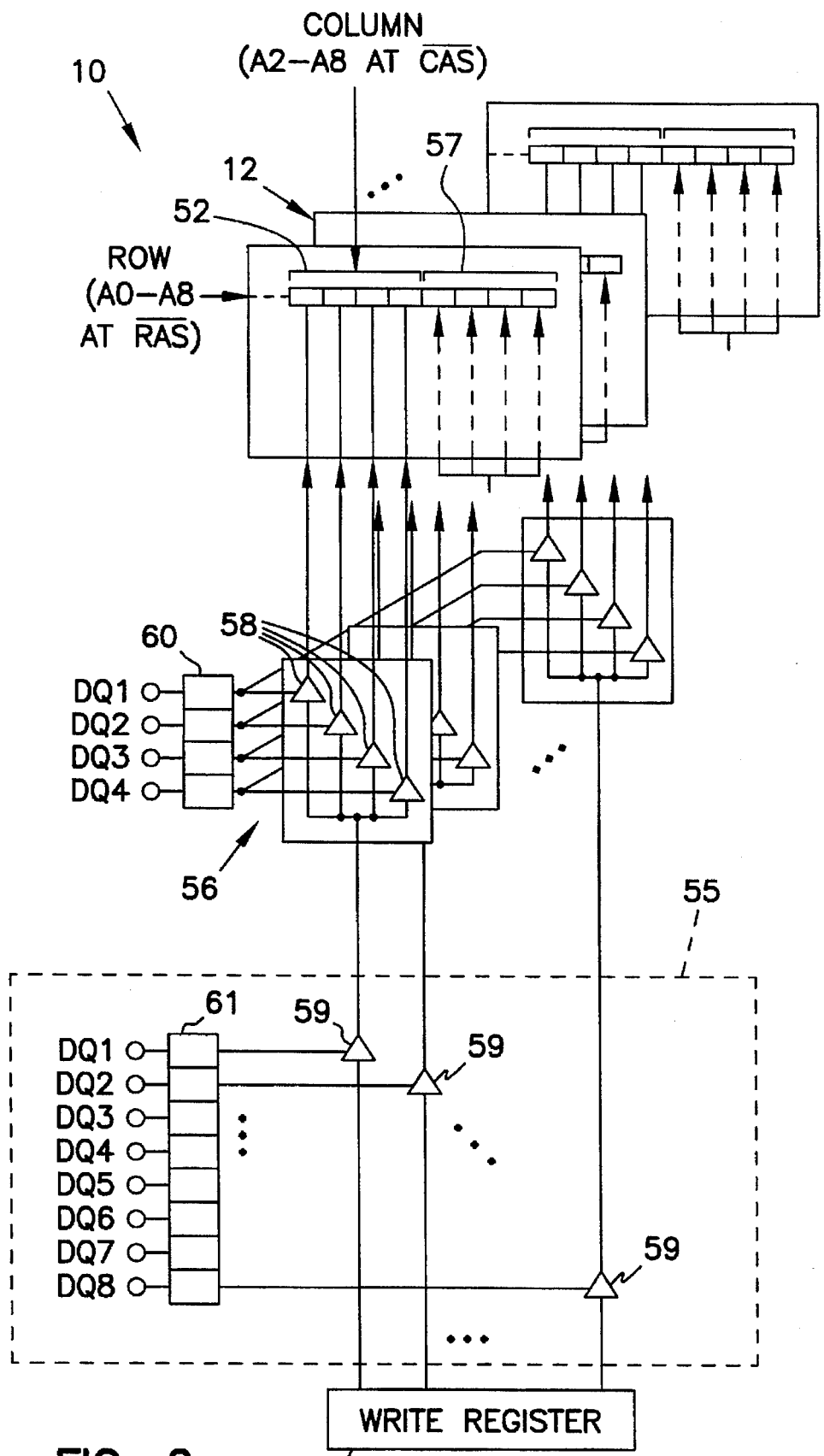
FIG. 2 is a block diagram illustrating 4-bit burst mode block write function in the VRAM of FIG. 1.

FIG. 2 is an illustrative diagram which will be used to describe both a selective four-bit block write function and a four-bit burst mode block write function, as opposed to a representation of the physical elements within VRAM 10. With respect to FIG. 2 illustrating a four-bit burst mode block write function, DRAM array 12 is shown as eight two-dimensional planes of memory cells. Together, the planes form rows and columns of eight-bit memory registers as already described. Individual memory cells are not shown, with the exception of two arbitrarily selected blocks of four consecutively-addressed memory cells 52, 57 in each plane. Memory cells 52, 57 are shown as examples of addressing during a first four-bit block write cycle and a subsequent four bit block write cycle when operating in burst mode. The first four-bit block 52 is addressed externally by an address applied on A0–A8 the second block 57 is internally addressed by incrementing the address of the first block 52 by four using the burst counter 17, further described below with reference to FIG. 5.

Write register 34 is an eight-bit static memory register. In a block write application, write register 34 is first initialized during a write register load cycle. Subsequently, data from write register 34 is written to blocks of memory registers within DRAM array 12, such as block 52, 57 during block write cycles.

With respect to FIG. 2 illustrating a non-burst mode selective block write function, during a selective block write cycle, a row address and a column address are applied to VRAM 10 by multiplexed address bus 16. VRAM 10 latches the row addresses from A0 through A8 at the falling edge of RAS*, and the column address from A2 through A8 at the falling edge of GAS*, similar to a normal write cycle. Least significant bits, A0 and A1, of the column address are disregarded during the selective block write cycle for a four-bit block write. If the block write was an eight-bit block write, least significant bits, A0–A2 would be disregarded. The row address and column block address form a memory register base address which is the address of the first memory register of a block of four adjacent memory registers within the row addressed.

Memory cells 52, in each of the logical planes of DRAM array 12, are an example of four adjacent memory registers within a row being simultaneously addressed for writing during selective block write cycles. Data is then written simultaneously from write register 34 to the block of adjacent memory registers through bit masking circuit 55 and column masking circuit 56. Data is not written from data bus 14.

Bit masking circuit 55 allows individual planes of bits to be masked from writing so that a memory write may be performed on specified bits without altering the remaining bits. Bit masking circuit 55 contains a bit mask register 61 and eight corresponding bit enable gates 59. Bit mask register 61 is loaded with a bit mask code from data signals DQ1 through DQ8 during a bit mask register load cycle. Each bit of bit mask register 61 corresponds to a bit of write register 34. A bit value of zero indicates that the corresponding write register bit is to be masked. A bit value of one indicates that the corresponding write register bit is to be written to DRAM array 12.

Column or register masking circuit 56 allows specification of a column or register mask code. The column mask code is latched in a column mask register 60 from data signals DQ1 through DQ4 at the latter of WE* and CAS* going low during a selective block write cycle. Each bit of column mask register 60 corresponds to one of the four adjacent column locations. A bit value of zero indicates that the corresponding column is to be masked. A bit value of one indicates that the corresponding column is to be written from write register 34.

Various timing diagrams for various cycles, such as write cycles are described in U.S. Pat. No. 5,282,177 issued to McLaury, entitled "Multiple Register Block Write Method and Circuit for Video DRAMs," assigned to the assignee of the present invention and entirely incorporated herein by reference thereto. Therefore, such timing for these cycles shall not be described further, with the exception of timing for a selective block write cycle, wherein a block of four consecutively-addressed memory registers within a row of DRAM array 12 are simultaneously written with data from write register 34.

Figure 3:
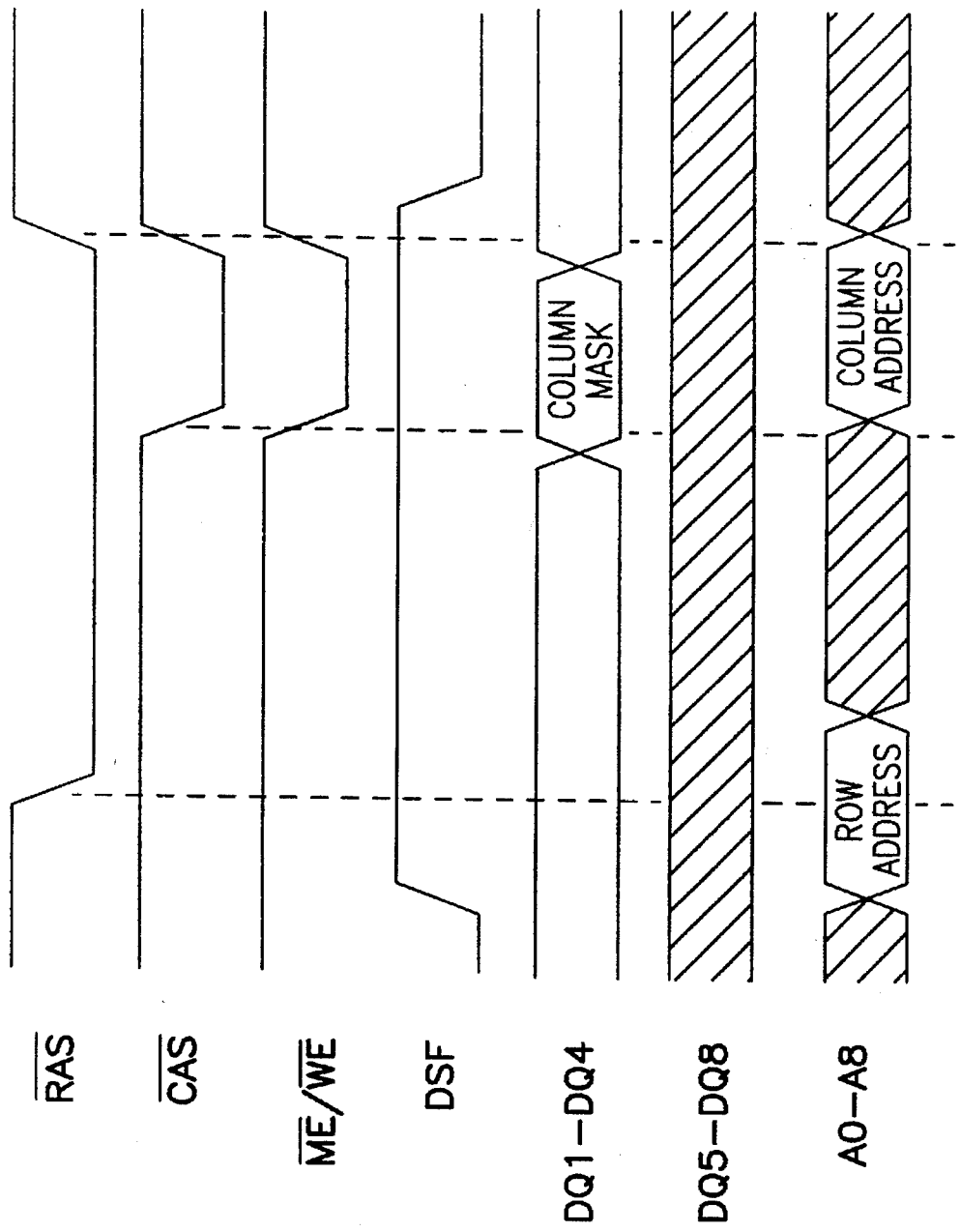
FIG. 3. is a prior art timing diagram of a selective block write cycle.

Per the timing diagram for a selective block write cycle of FIG. 3, as RAS* goes low, ME*/WE* is high and DSF is high to signal initiation of a selective block write cycle. DSF additionally must be high as CAS* goes low. RAS* going low also signals to VRAM 10 the presence of a valid row address at A0 through A8. ME*/WE* and CAS* are lowered to signal the presence of a valid column block address at A2 through A8. The contents of write register 34 are written to the addressed block of memory registers at the latter of CAS* and ME*/WE* to go low. A0 and A1 are ignored in forming the column block address during a selective block write cycle. A column mask code is presented at DQ1 through DQ4 as GAS* goes low. DQ5 through DQ8 are unused during selective four-bit block write cycles.

As is apparent from the prior art timing diagram of FIG. 3, after each selective block write cycle, whether the next sequential cycle to be performed is another block write cycle, read cycle, or any other cycle, an external column address on A0–A8 must be presented to select the next memory register to be addressed. With block write operating in burst mode in accordance with the present invention, this is not necessary as shown in the timing diagrams of FIGS. 4A–4D.

Figure 4A:
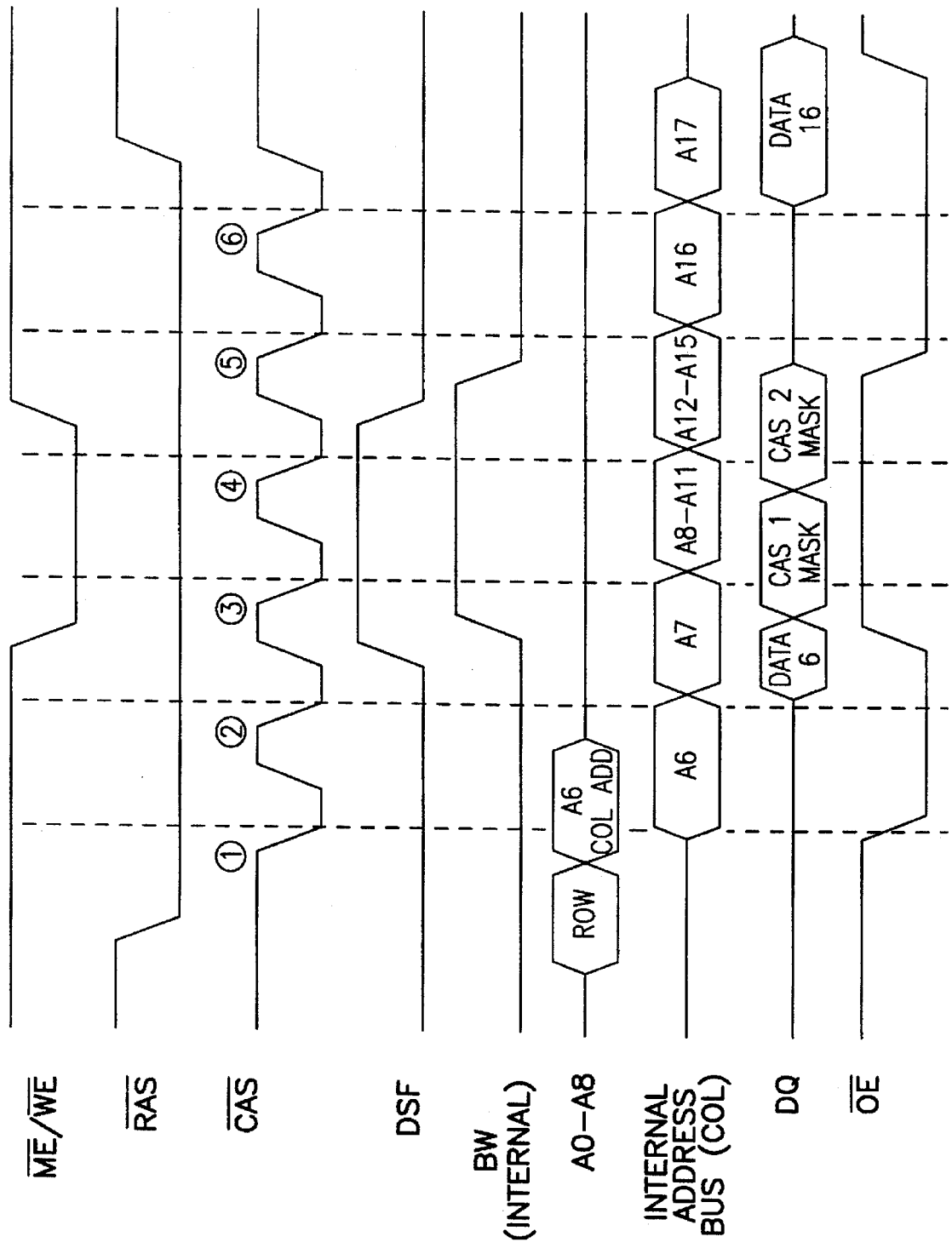
FIG. 4A is a timing diagram operating in burst mode having an eight cycle burst length with latency of one on read followed by a block write.
Figure 4B:
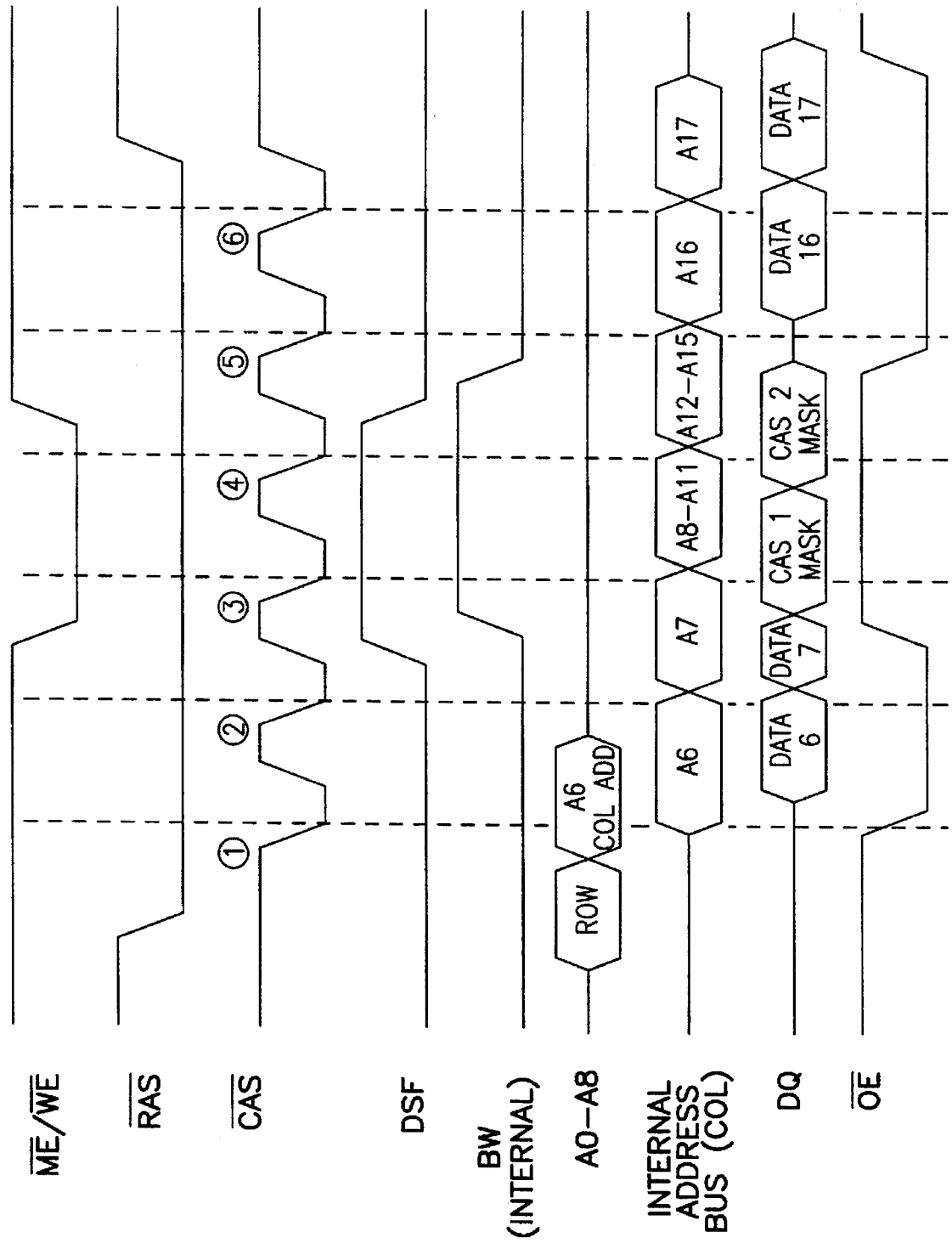
FIG. 4B is a timing diagram operating in burst mode having an eight cycle burst length with no latency on read followed by a block write.
Figure 4C:
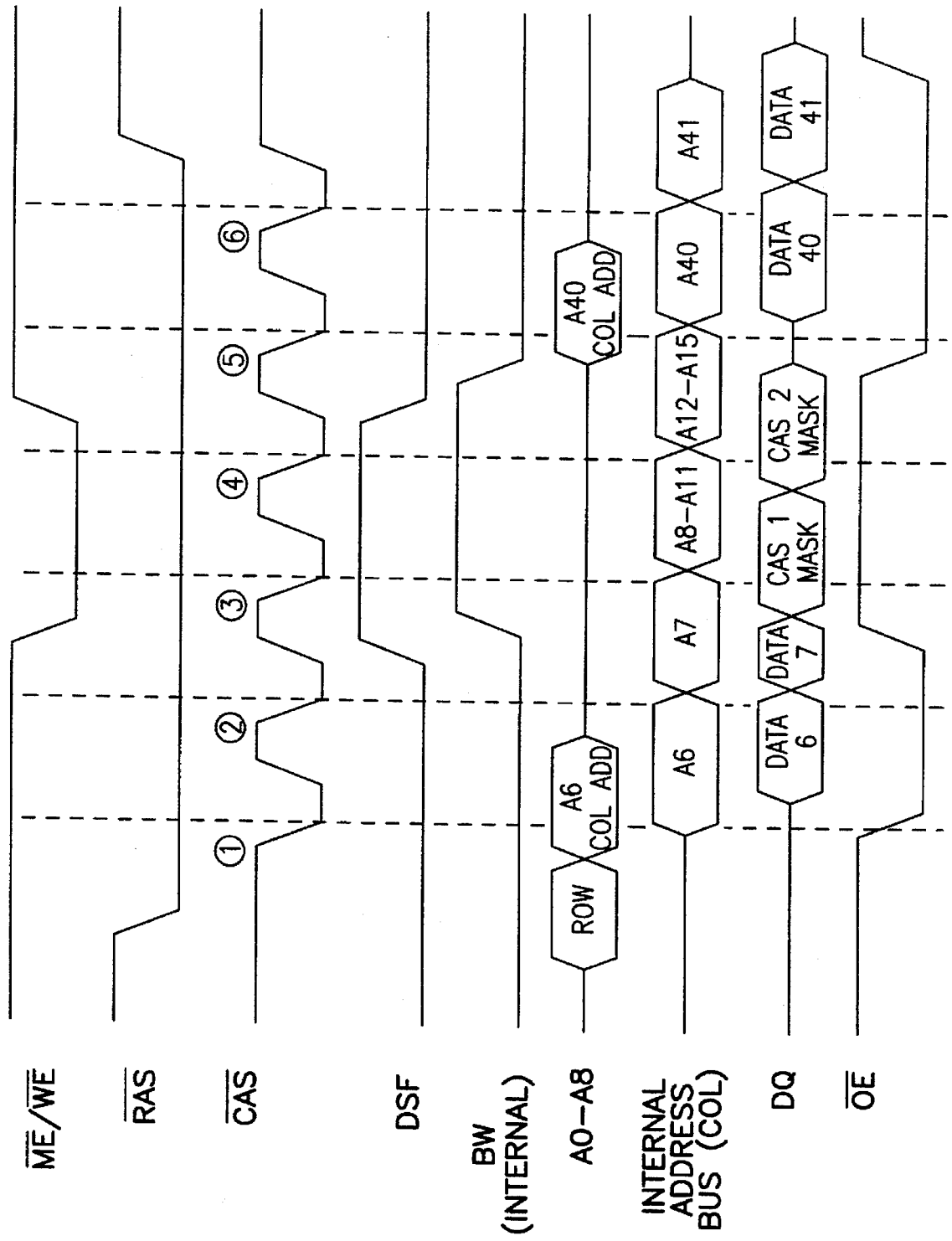
FIG. 4C is a timing diagram operating in burst mode having a four cycle burst length with no latency.

FIGS. 4A–4D are timing diagrams of block writes and other functional modes such as read modes operating in burst mode. FIG. 4A is a timing diagram of operation in burst mode with CAS latency of one clock on read. This timing diagram shows two initial read cycles followed by two sequential block write cycles and ending in two read cycles with internal addressing for each cycle. The burst length for the burst mode in FIG. 4A is set at a predetermined burst length of eight CAS* cycles. Burst length is the number of CAS* cycles during which an external address is ignored. An initial external address at the beginning of the burst length is incremented during the burst length for operation in one or more functional modes such as burst read or burst block write. The burst length may be more or less than eight and is only limited on the upper end by the number of column addresses in a row of the DRAM array. For example, as shown in FIG. 4C, the burst length is set at four and as such an external address is applied at the fifth CAS* cycle. With the burst length of eight CAS* cycles in the timing diagram of FIG. 4A, no external address is applied in this diagram after the external row address and column address A6 are presented because only five CAS* cycles are illustrated. The burst length can be hardwired or programmed.

Further with reference to FIG. 4A, the first read cycle is initialized when RAS* goes low, ME*/WE* is high and DSF is low. RAS* going low signals to VRAM 10 the presence of a valid row address at A0 through A8. Operation in burst mode has already been set such as by the part always operating in burst mode for column addressing or by application of certain inputs as previously described. At the falling edge of the first CAS* cycle and when OE* is lowered, a valid external column address A6 is recognized at the beginning of an eight CAS* cycle burst length. The Data 6 at A6 is then read out of the device on DQ1–DQ8 after a clock latency of one clock at the second CAS* cycle.

Figure 5:
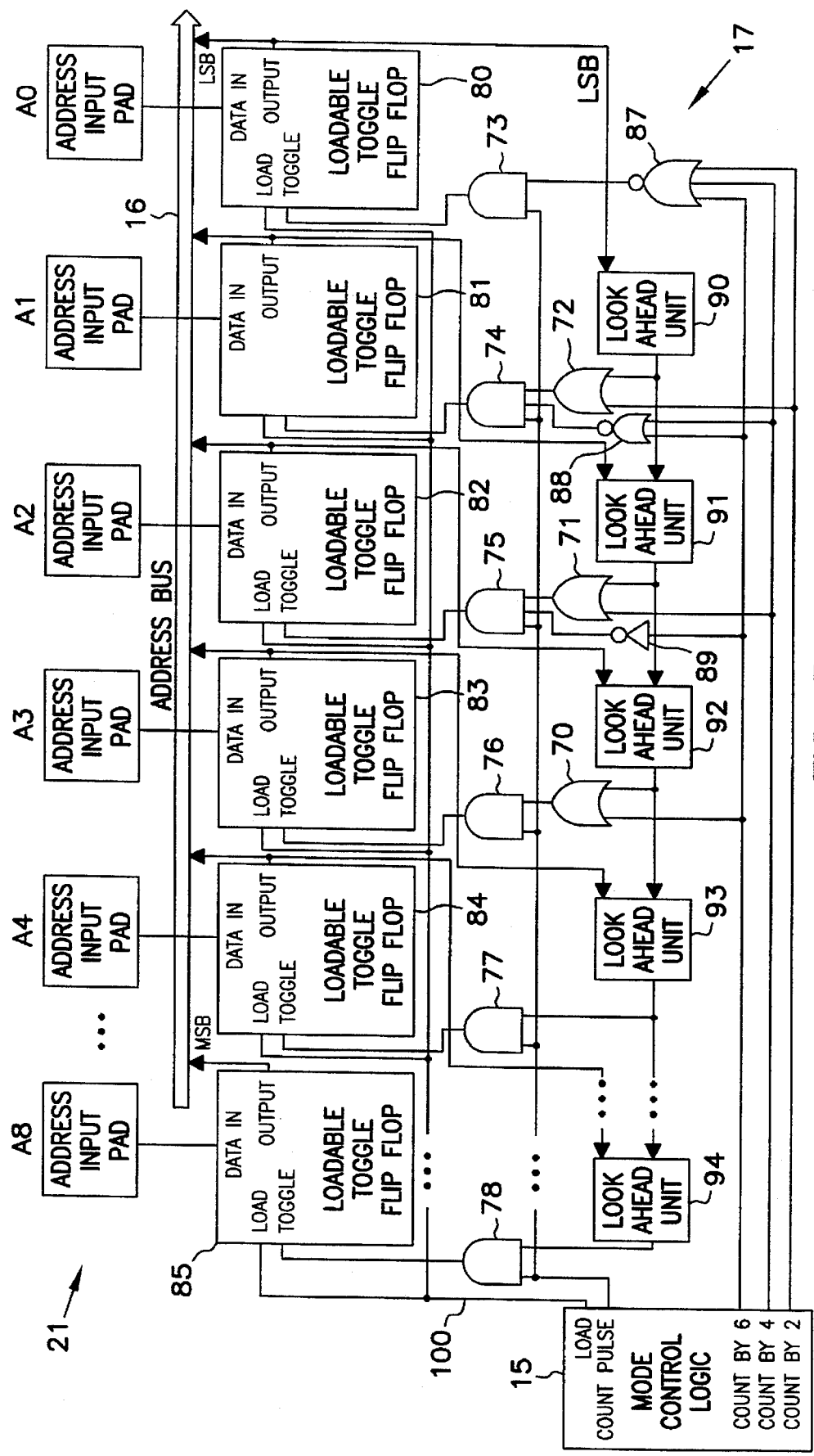
FIG. 5 is a block diagram of the burst counter and mode control logic of FIG. 1.

With operation in burst mode, external column addresses after external column address A6 are ignored during the burst length and burst counter 17, as shown in FIG. 5, internally provides subsequent incrementally generated addresses, incremented by each CAS* cycle as a function of the mode in which the DRAM array is being accessed. In burst read mode, the address is incremented to address A7 upon the falling edge of the second CAS* cycle; the increment being by one. However, as shown in FIG. 4A, an internal block write is asserted as CAS* cycles for the third time when DSF goes high and ME*/WE* goes low, and the functional mode changes from burst read mode to block write in burst mode. Thus, due to the clock latency for reads, data at A7 is not read out of the device on DQ1–DQ8. Rather, a column mask code (CAS 1 Mask) is presented at DQ1 through DQ4 when ME*/WE* and CAS* are lowered to signal the presence of a valid internally generated column block address of A8 through A11. The contents of write register 34 are then written to the internally addressed block of memory registers when the latter of CAS* and ME*/WE* go low.

Further, with operation in burst mode and block write asserted on the falling edge of the third CAS* cycle, the burst counter 17 shown in FIG. 5, internally increments the address by four and the next internally generated address of A12 through A15 is presented when CAS* and write enable go low in the fourth CAS* cycle. A column mask code (CAS 2 Mask) is presented at DQ1 through DQ4 as CAS* goes low and the contents of write register 34 are then written to the next sequentially addressed block of memory registers, A12 through A15. At the falling edge of the fourth CAS* cycle, the burst counter 17, as shown in FIG. 5, once again increments the address A12 by four to column address A16.

At the fifth CAS* cycle in the eight cycle burst length, the four-bit block write is no longer asserted. As such, burst read mode is once again established and the burst counter 17, as shown in FIG. 5, is only incremented by one in burst read mode. The data at Address 16 and 17 is then read out in the manner described above with regard to burst read mode with one clock latency. Because of the latency, Data 16 is not read out of the device on DQ1–DQ8 until the sixth CAS* cycle.

The timing diagram of FIG. 4B is substantially the same as the timing diagram of FIG. 4A, except that the burst read mode is operated without CAS latency of one clock. Therefore, the Data 6 is read out of the device on DQ1–DQ8 at CAS* cycle 1 and Data 7 is read out of the device on DQ1–DQ8 at CAS* cycle 2. Likewise, Data 16 is read out of the device on DQ1–DQ8 at CAS* cycle 5 and Data 7 is read out of the device on DQ1–DQ8 at CAS* cycle 6. The burst length for this diagram is also eight CAS* cycles and therefore external addresses are ignored after the external column address A6.

The timing diagram of FIG. 4C shows operation in burst mode with a predetermined burst length of four and with no CAS* latency on read. This timing diagram shows two initial read cycles followed by two sequential block write cycles and ending in two read cycles with internal addressing during the four CAS* cycle burst length after external column address A6 is presented and further internal addressing during a second burst length after presentation of external column address A40.

Further with reference to FIG. 4C, the first read cycle is initialized when RAS* goes low, ME*/WE* is high and DSF is low. RAS* going low signals to VRAM 10 the presence of a valid row address at A0 through A8. Operation in burst mode has already been set such as by the part always operating in burst mode for column addressing at a particular burst length or by application of certain inputs as previously described. At the falling edge of the first CAS* cycle and when OE* is lowered, a valid external column address A6 is recognized at the beginning of a four CAS* cycle burst length. The Data 6 at address A6 is read out of the device on DQ1–DQ8 at the first CAS* cycle.

With operation in burst mode, external column addresses after external column address A6 are ignored during the burst length and burst counter 17, as shown in FIG. 5, internally provides subsequent incrementally generated addresses, incremented by each CAS* cycle as a function of the mode in which the DRAM array is being accessed. In burst read mode, the address is incremented to address A7 upon the falling edge of the second CAS* cycle; the increment being by one. The Data A7 is read out of the device on DQ1–DQ8 from address A7 during the second CAS* cycle. With an internal block write asserted as CAS* cycles for the third time when DSF goes high and ME*/WE* goes low, the functional mode changes during the burst length from burst read mode to block write in burst mode. A column mask code (CAS 1 Mask) is presented at DQ1 through DQ4 when ME*/WE* and CAS* are lowered to signal the presence of a valid internally generated column block address of A8 through A11. The contents of write register 34 are then written to the internally addressed block of memory registers when the latter of CAS* and ME*/WE* go low.

Further, with operation in burst mode and block write asserted, on the falling edge of the third CAS* cycle, the burst counter 17, as shown in FIG. 5, increments the address by four and the next address of A12 through A15, internally generated by burst counter 17, is presented when CAS* and write enable go low in the fourth CAS* cycle. A column mask code (CAS 2 Mask) is presented at DQ1 through DQ4 as CAS* goes low and the contents of write register 34 are then written to the next sequentially addressed block of memory registers, A12 through A15. With operation in burst mode having a burst length of four, the burst counter 17 does not increment the address A12 by four to column address A16 at the falling edge of the fourth CAS* cycle, but rather, an external column address A40 is recognized at the beginning of another burst length.

At the fifth CAS* cycle, the four-bit block write is no longer asserted. As such, burst read mode is once again established and the burst counter is only incremented by one in burst read mode. The data at column address A40 and A41 are then read out in the manner described above without latency. Data 40 is read out of the device on DQ1–DQ8 at CAS* cycle 5 and Data 41 is read out of the device on DQ1–DQ8 at CAS* cycle 6. As the burst length is four in this diagram, two more functional cycles are performed before another external address is recognized at CAS* cycle 9.

Figure 4D:
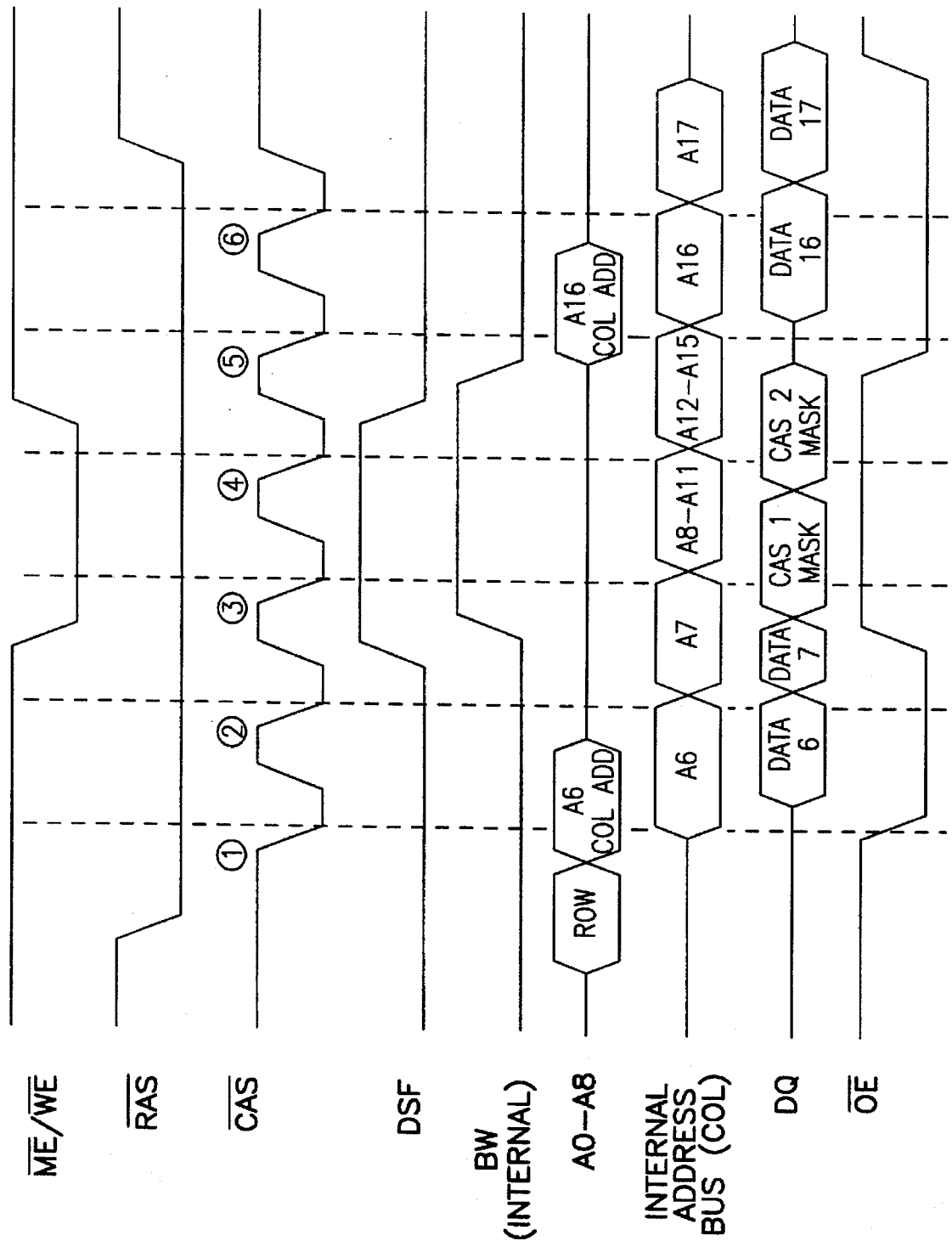
FIG. 4D is a timing diagram operating in burst mode having an eight cycle burst length with no latency using the counter of FIG. 6.

The timing diagram of FIG. 4D is substantially the same as the timing diagram of FIG. 4B, except that the burst counter utilized is an alternate embodiment of the burst counter 17 of FIG. 5. The alternate burst counter 117 of FIG. 6, does not prevent the flip flops 180–182 for the least significant bits, which are ignored during incrementing the address internally, from toggling when the address is incremented by the burst counter 117 as described further below. Therefore, when a functional mode, such as a read mode, is asserted after a block write, an external address is recognized. For example, with reference to FIG. 4D and FIG. 6 and operating in a burst mode having an eight cycle burst length, because the flip flops 180 and 181 are not prevented from toggling during block writes to A8–A11 and A12–A15, the next address presented at the falling edge of the fifth CAS* cycle would not be A16 when using burst counter 117 of FIG. 6. Therefore, an external address must be presented at the falling edge of the fifth CAS* cycle to perform the asserted function at the external address. As shown in FIG. 4D, the external address presented is A16 and Data 16 is read from A16, but any other register in the row may be addressed. After the external address A16 is recognized, burst read continues.

The timing diagrams of FIG. 4A–4D are for example only. They are not to be taken as limiting the scope of present invention. The functions chosen to be shown with the block write operating in burst mode are described to illustrate the burst mode block write and are not to be taken as limitations thereto. Other functional modes may also be performed in burst mode during the burst length with the block writes. Even different size block writes may be performed during a burst length. For example, a four bit block write could be performed on a second CAS* cycle and an eight bit block write could be performed on the third CAS* cycle. The number of combinations with respect to the present invention are too numerous to describe and the present invention is only limited as described in the accompanying claims.

As described above with respect to the timing diagrams of FIG. 4A–4D, in a burst mode environment of a predetermined burst length, an external starting address for the burst length is recognized. The starting address is then internally sequentially incremented during the cycle of the burst length either in a forward or backward manner to access the next memory register as a function of the read or write performed during that cycle. For example, if a four bit block write is performed during the second cycle in a four cycle burst length, then the address for the function performed during the second cycle is incremented by four reflecting the four bit block write performed. A counter incrementing by one will not work when doing block writes in the burst mode where the block writes are of the block size "n"; "n" being the number of memory registers or cells in a plane of memory being block written. The block size "n" is generally set to 4 or 8 and corresponds to the equation $n=2^x$ wherein x is the number of addresses ignored to create a block. For example, the number of addresses ignored in a four-bit block write is 2 and in an eight-bit block is 3. These are the least significant addresses, for example addresses A0, A1, and A2 in an eight-bit block write. Since a counter incrementing by one will not allow for block write in burst mode, the incrementing of the addresses internally is changed when block write mode is used in burst mode by a counter such as shown in FIG. 5.

The burst counter 17 of FIG. 5 allows for internal incrementing or counting by 1, 2, 4, or 8. In burst mode operation, mode control logic 15 of control logic 13 controls the manner in which the internally generated addresses are incremented. Once the external initial starting address for a burst length is loaded into the loadable toggle flip flops 80–85 via the address pins 21 including A0 and A8 and load line 100, the count pulse line and count by 2, 4, 8 lines are utilized to control the toggle of the loaded address in order to internally increment the address as desired by the function being performed. If, for example, a burst read mode is asserted, then by way of look ahead units 90–94, carry bits are provided from unit to unit and upon cycling the count pulse the appropriate flip flop is toggled to increment the address by one. In burst mode when block write is asserted, the carry bits provided from unit to unit are overridden by the assertion of either a count by 2, 4, or 8 line connected to the corresponding or gate 70–72. The output of the or gate and the count pulse line assertion forces the toggle of the appropriate flip flop 80–85 to increment by the count desired via and gates 73–78. For example, if an eight-bit block write is performed in burst mode, the count by 8 line is asserted to or gate 70, and flip flop 83 is toggled via and gate 76 upon assertion of the count pulse line. By A3 toggling, the address is then incremented by eight. Note that the lower significant bits are considered "don't cares" during multi-count function. For example, for eight-bit block write, the lower significant bits A0–A2 are disregarded. However, in order to prevent the flip flops 80–82 from toggling such that when the address is incremented by eight for an eight bit block write, the count by 8 line is also applied to nor gates 87 and 88 and invertor 89 to inhibit toggling of the flip flops for the least significant bits A0–A2 via and gates 73–75. For a four bit block write, the count by 4 line is applied to nor gates 87 and 88 to prevent such toggling and for a two bit block write the count by 2 line is applied to nor gate 87 to inhibit such toggling of flip flop 80.

Figure 6:
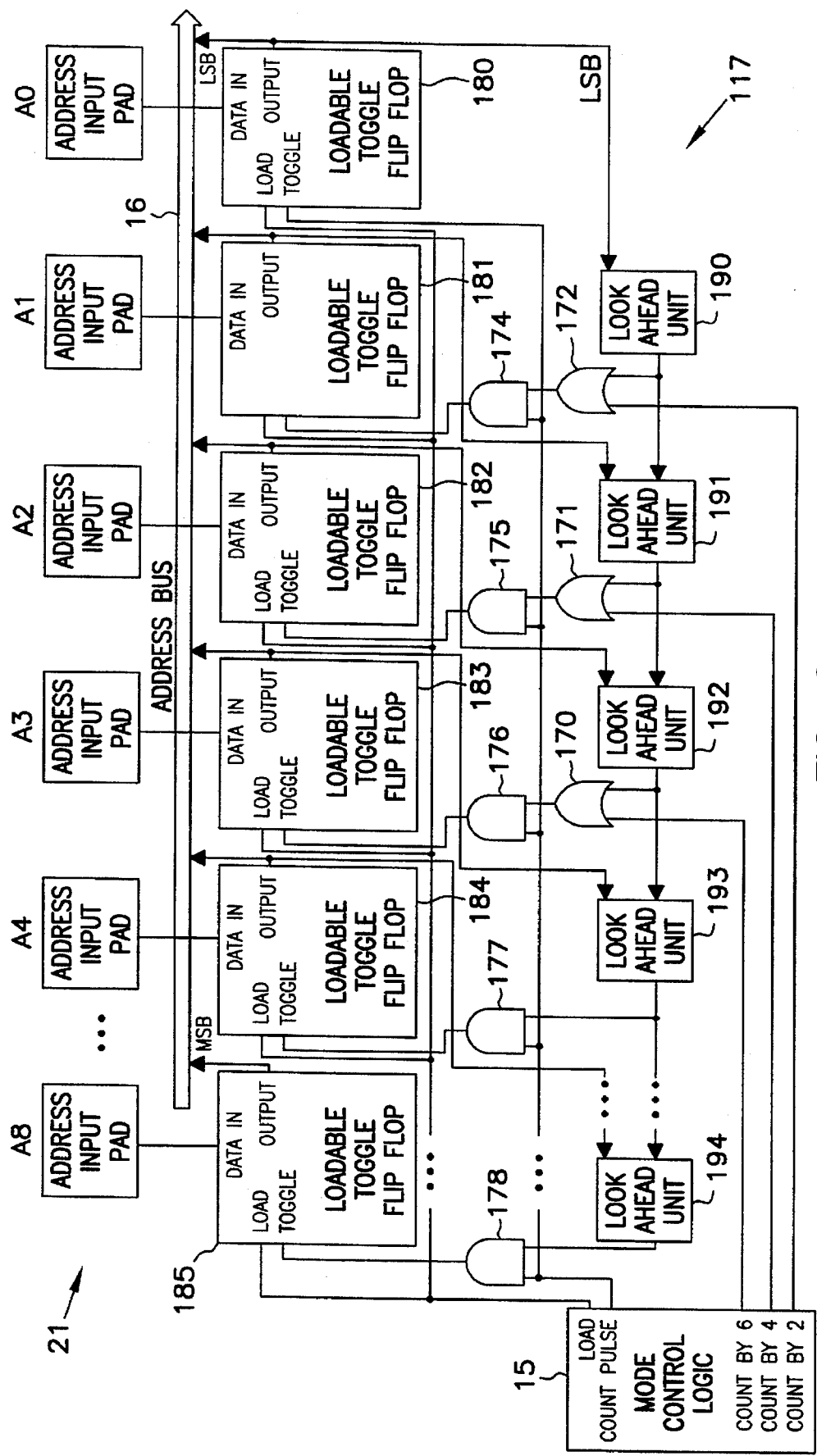
FIG. 6 is a block diagram of an alternate embodiment of the burst counter of FIG. 5.
Figure 5:
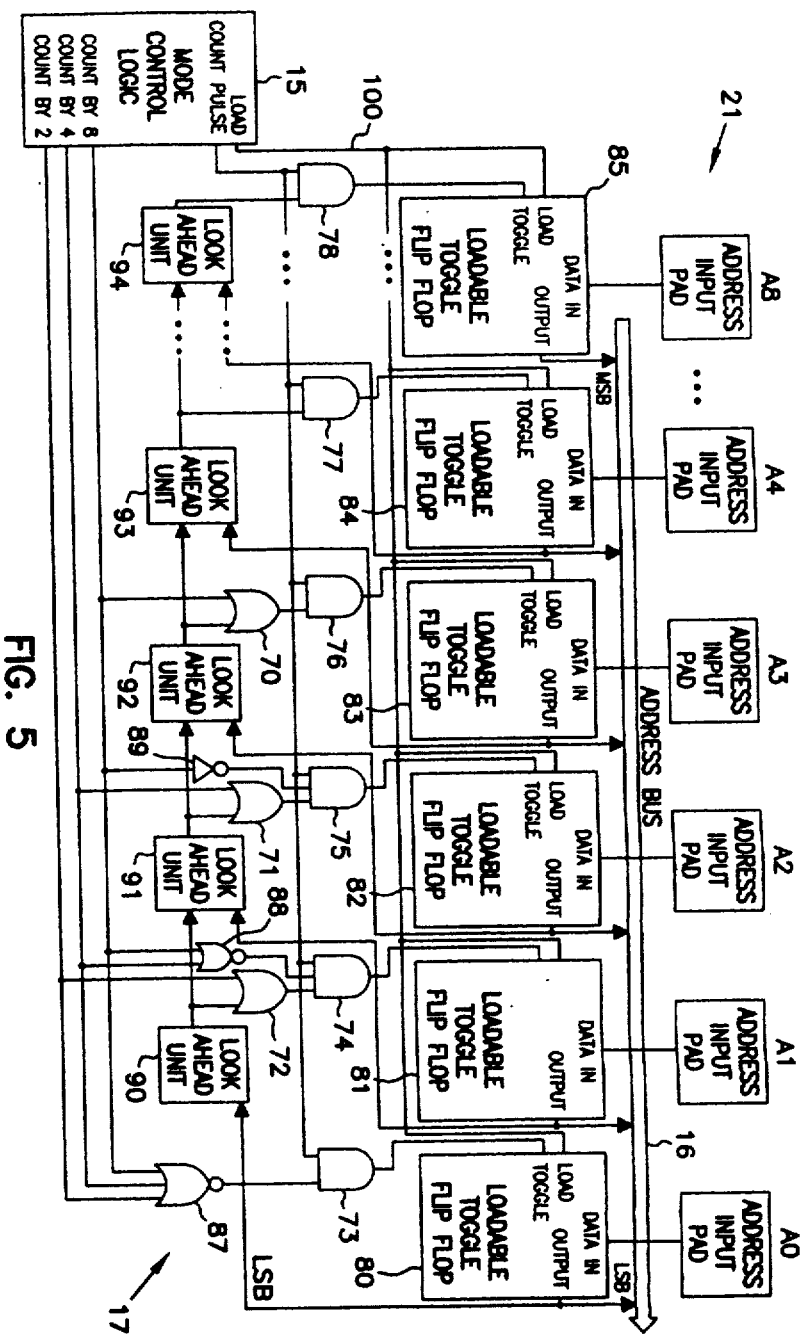
Figure 6:
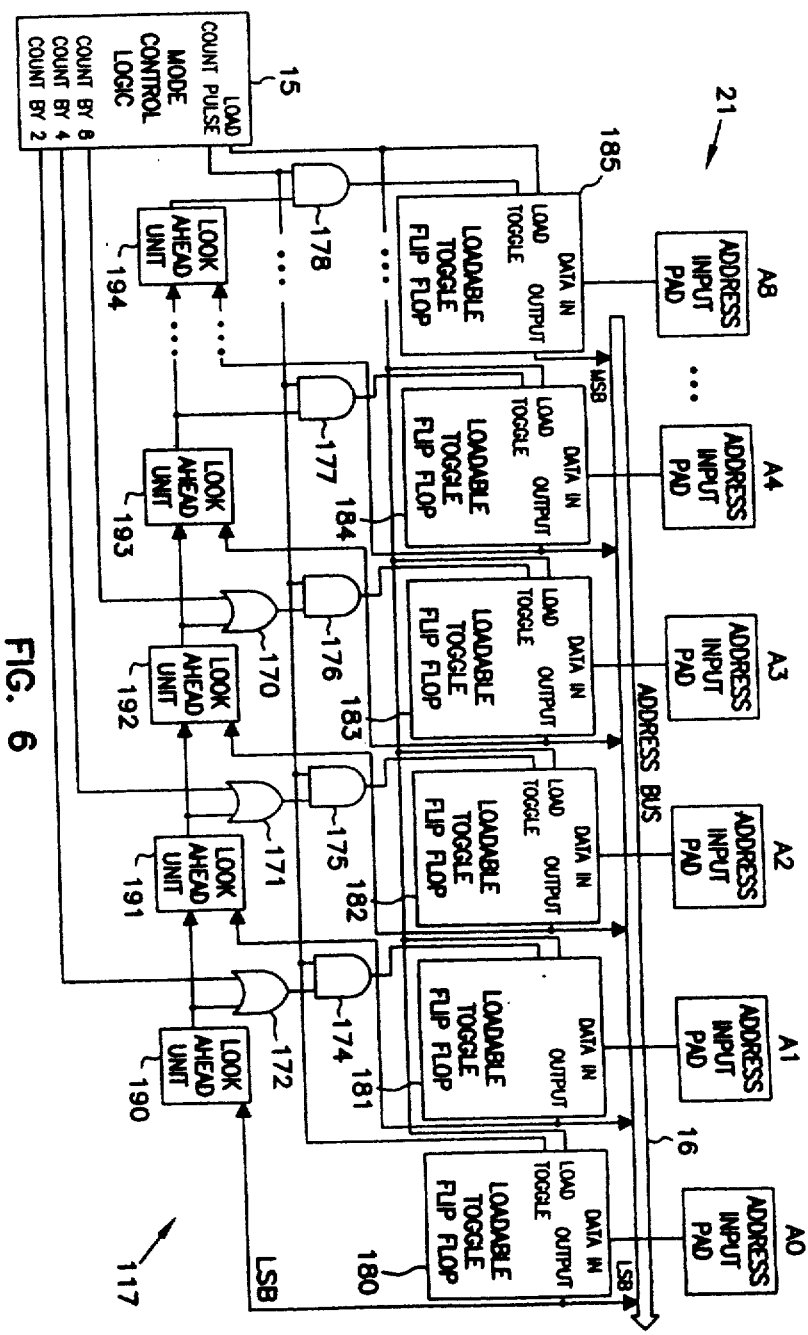

The burst counter 117 of FIG. 6 includes flip flops 180–185, look ahead units 190–194, and gates 174–178, and or gates 170–172 which are similar to the logic of burst counter 17 of FIG. 5. The burst counter 117 also operates in a similar manner. However, burst counter 117 does not include nor gates like nor gates 87 and 88, an invertor like invertor 89, or an and gate like and gate 73 as shown in FIG. 5, which when appropriately connected inhibit the toggling of the flip flops for the least significant bits upon a block write as described above. For this reason an external address must be recognized after a block write to perform a different mode such as burst read as explained above with regard to FIG. 4D. However, this counter does provide for incrementing the column address internally for block write operating in burst mode. For example, if an eight-bit block write is performed in burst mode, the count by 8 line is asserted to or gate 170, and flip flop 183 is toggled via and gate 176 upon assertion of the count pulse line. By A3 toggling, the address is then incremented by eight. Note that the lower significant bits are considered "don't cares" during multi-count function. For example, for eight-bit block write, the lower significant bits A0–A2 are disregarded.

It should be readily apparent to one skilled in the art that different components may be used to achieve the same function as described with respect to internally incrementing addresses for the burst mode block write function. The specific embodiments described are examples only and are not to be taken as the only manner of achieving the function of the present invention and the claims are not to be limited thereby but only limited as described in the accompanying claims. The burst mode counters 17 and 117 allow for incrementing by 1, 2, 4, or 8 bits per the mode control logic 15. In addition, it should be recognized that additional logic circuitry could be added such that the addresses may be incremented in either a forward or backward manner as long as it is sequentially performed. Sequential addressing in context of the burst mode block write means, for example, that after a four-bit block write the next sequentially available register is four from the first register of the block.

The present invention may be utilized in conjunction with the multiple write register concepts described in U.S. Pat. No. 5,282,177 entitled "Multiple Register Block Write Method and Circuit for Video DRAMs" incorporated by reference herein. The multiple write register allows a block write to be performed from one of a plurality of write registers rather than a single write register.

It is to be understood, however, that even though numerous characteristics of the present invention have been set forth in the foregoing description, together with details of the structure and function of the invention, the disclosure is illustrative and changes in matters of order, shape, size, and arrangement of the parts, and various properties of the operation may be made within the principles of the invention and to the full extent indicated by the broad general meaning of the terms in which the appended claims are expressed.

What is claimed is:

1. An integrated circuit comprising:
   an array of randomly addressable registers, blocks of the randomly addressable registers being addressable by an address for writing data to a block of randomly addressable registers simultaneously; and
   a burst counter for incrementing the address when at least one individual block write is performed to address a next block of addressable registers of the array of randomly addressable registers.

2. The integrated circuit according to claim 1, further comprising control logic for initiating a plurality of functional modes, including a block write mode during which block writes are performed, the burst counter increments the address as a function of at least one of the plurality of functional modes.

3. The integrated circuit according to claim 1, wherein the burst counter sequentially increments the address by n, where n is the number of bits in a plane of the array written to a block during the at least one individual block write.

4. The integrated circuit according to claim 3, wherein a plurality of adjacent blocks of the randomly addressable registers are addressed such that individual block writes are sequentially performed during a plurality of block write cycles, the burst counter incrementing an address of each block of the plurality of adjacent blocks by n for each of the individual block writes performed.

5. The integrated circuit according to claim 2, wherein the array of randomly addressable registers are arranged in rows and columns, each of the randomly addressable registers is addressable by a row and a column address, and further wherein the burst counter increments the column address of a row as a function of at least one of the plurality of functional modes performed in a burst mode.

6. The integrated circuit according to claim 5, wherein the at least one of the plurality of functional modes is a read function mode, the burst counter incrementing the column address of a row by one to address the next addressable register.

7. The integrated circuit according to claim 5, wherein the at least one of the plurality of functional modes is the block write mode, the burst counter incrementing the column address of the row by n, n generally corresponding to $n=2^x$ wherein x is a number of addresses ignored to create a block written during the block write mode.

8. The integrated circuit of claim 1, wherein the randomly addressable registers contain substantially identical data.

9. A method of addressing, comprising the steps of:
   providing an array of randomly a addressable registers;
   addressing a block of the randomly addressable registers by an address to perform a block write;
   writing to the block randomly addressable registers simultaneously: and
   internally incrementing the address for addressing a next addressable register of the randomly addressable registers upon performance of the block write.

10. The method of addressing according to claim 8, wherein the method further comprises the step of selecting at least one of a plurality of functional modes for writing to or reading from the randomly addressable registers in a burst mode, the plurality of functional modes including at least a block write mode for performing the block write; and wherein the incrementing step includes the step of incrementing the address in a sequential manner as a function of the selected mode.

11. The method of addressing according to claim 10, wherein the providing step includes the step of providing the array of randomly addressable registers arranged in rows and columns;

wherein the addressing step includes the step of addressing the block of randomly addressable registers by a row and a column address; and wherein the incrementing step includes the step of incrementing the column address of a row in a sequential manner as a function of the selected mode.

12. The method of addressing according to claim 10, wherein the selected mode is a read mode, the incrementing step including the step of incrementing the address by one to address a next randomly addressable register.

13. The memory device according to claim 9, wherein the incrementing step includes the step of incrementing the address by n, wherein n is the number of bits per plane of the array of randomly addressable registers written during the block write.

14. The method of claim 8, wherein the randomly addressable registers contain substantially identical data.

\* \* \* \* \*

UNITED STATES PATENT AND TRADEMARK OFFICE
CERTIFICATE OF CORRECTION

PATENT NO. : 5,657,287
DATED : August 12, 1997
INVENTOR(S) : McLaury, et. al.

It is certified that error appears in the above-identified patent and that said Letters Patent is hereby corrected as shown below:

The drawing sheets consisting of Figs. 5 and 6, should be deleted to be replaced with the drawing sheets, consisting of Figs. 5 and 6, as shown on the attached pages.

At Col. 12, line 51, please delete "substantially identical" and insert --similar--.

At Col. 12, line 53, please delete "a".

At Col. 14, line 12, please delete "substantially identical" and insert --similar--.

At Col. 12, line 58, please delete ":" to --;--.

At Col. 13, line 5, please delete "the" and insert --an--.

Signed and Sealed this

Seventh Day of April, 1998

Attest:

*Attesting Officer*

BRUCE LEHMAN

*Commissioner of Patents and Trademarks*